United States Patent [19]

Bu-Abbud

[11] Patent Number: 4,958,926
[45] Date of Patent: Sep. 25, 1990

[54] CLOSED LOOP CONTROL SYSTEM FOR LASER

[75] Inventor: George Bu-Abbud, Plano, Tex.

[73] Assignee: Reliance Comm/Tec Corporation, Chicago, Ill.

[21] Appl. No.: 264,356

[22] Filed: Oct. 31, 1988

[51] Int. Cl.⁵ .................. G01N 21/88; H01S 3/133
[52] U.S. Cl. .................................. 356/73.1; 250/205
[58] Field of Search ................. 356/73 L; 250/205; 372/38

[56] References Cited

U.S. PATENT DOCUMENTS

| | | | |
|---|---|---|---|
| 4,009,385 | 2/1977 | Sell | 372/38 |
| 4,243,320 | 1/1981 | Gordon | 356/73.1 |
| 4,292,606 | 9/1981 | Trimmel | 372/38 |
| 4,355,395 | 10/1982 | Salter et al. | 372/38 |
| 4,592,057 | 5/1986 | Comerford | 372/38 X |
| 4,606,632 | 8/1986 | Hillerich | 356/731 |
| 4,674,872 | 6/1987 | Wright | 356/731 |
| 4,708,471 | 11/1987 | Beckmann | 356/731 |
| 4,732,469 | 3/1988 | Souma | 356/731 |
| 4,733,398 | 3/1988 | Shibagaki et al. | 372/38 X |
| 4,737,026 | 4/1988 | Dalgoutte et al. | 356/731 |
| 4,838,689 | 6/1989 | Neumann | 356/73.1 |
| 4,845,720 | 7/1989 | Koishi et al. | 250/205 X |

FOREIGN PATENT DOCUMENTS

| | | | |
|---|---|---|---|
| 251620 | 11/1987 | German Democratic Rep. | 356/73.1 |
| WO88/05531 | 7/1988 | Int'l Pat. Institute | 356/73.1 |

Primary Examiner—Vincent P. McGraw
Attorney, Agent, or Firm—Michael M. Rickin

[57] ABSTRACT

A closed loop control system for a laser which is used in an instrument which may be an optical time domain reflectometer. The system uses the output light of the laser and the light from a fiber to which the laser light is connected to initially set the bias and pulse current amplitudes to the laser and adjust the gain of the receiver which is part of the control system. The control system also responds to light from the fiber to continuously control the pulse current amplitude and receiver gain so that the amplitude of the electrical signal representative of that light is kept within the operating range of the receiver electronics.

17 Claims, 6 Drawing Sheets

INITIAL LASER CONTROL SETUP

Fig.7a

CONTINUOUS ADJUST LOOP

Fig.7b

CLOSED LOOP CONTROL SYSTEM FOR LASER

BACKGROUND OF THE INVENTION

1. Field of the Invention

This invention relates to a system for controlling the power of a laser used in connection with optical fiber and more particularly to such a system which automatically controls the power output of the laser to ensure maximum dynamic range for various fault conditions and also automatically compensates for changes in laser characteristics arising as a result of changes in temperature and aging.

2. Description of the Prior Art

Providers of telecommunications transmission services are increasingly making use of optical fiber. There already exists today several networks which provide long distance data and/or voice services over such fiber. The fiber is usually buried in the ground. Lasers are used in connection with such services for not only providing the signal(s) to be transmitted on such fibers but also for testing the fibers.

One such testing use is for determining the length and attenuation of a reel of optical fiber. Another such use is in an optical time domain reflectometer (OTDR) for determining if a fault such as a break has occurred on the fiber and the location of the fault. A more detailed discussion of the use of lasers in reflectometers as well as various prior art embodiments therefor may be obtained by referring to U.S. Pat. Nos. 4,606,632; 4,674,872; 4,708,471; 4,732,469 and 4,737,026.

As can well be appreciated buried fiber can accidentally be cut by digging. In some instances the persons doing the digging may not even know that they have cut the fiber. It is important therefore for the telecommunications service provider to be able to easily determine if a fault such as a break has occurred on the fiber and the location of the fault.

At present the service provider is usually first notified of a fault on the fiber and then must send a technician with an OTDR to the office nearest to the fault. The technician connects the OTDR to the fiber through a fiber optic connector and then proceeds to control the power of the laser in the OTDR in an attempt to locate the fault. The time it takes to locate the distance that the fault is from the office and the accuracy with which that measurement is made depends to a great extent on the skill of the technician. It is, however, desirable to have an OTDR which can be directly and permanently connected to optical fiber. It is further desirable that such an OTDR be capable of automatically compensating for changes in laser characteristics. It is also further desirable that when such an OTDR determines that a fault has occurred that it automatically and accurately provides the location of the fault from the office where it is located.

For such an OTDR the location of the fault from the office no longer depends on the skill of the technician. In addition, such an OTDR can be connected to the fiber in an unattended office as a technician is no longer needed to adjust the OTDR. The occurrence of a fault can then be signaled to a remote manned site. A technician can then be sent to the office signaling the fault. All that the technician has to do is read the output of the OTDR to find the location of the fault. The laser power control of the present invention allows for an OTDR which meets the above requirements.

SUMMARY OF THE INVENTION

An instrument which includes a laser and a closed loop control system for the laser. In response to a current pulse from a source which also provides the bias current for the laser, the laser generates output light to an optical fiber. The instrument has a receiver which detects light from the fiber when the laser output light is connected to the fiber. The receiver has amplitude limits, i.e. a predetermined operating range, and an adjustable gain. The receiver provides an output signal whose amplitude range is related to the amplitude range of an electrical signal representative of light detected from the fiber multiplied by the adjustable gain of the receiver. The instrument also has means for determining when the output signal amplitude range is not substantially equal to the predetermined operating range of the receiver. Also included in the instrument is a control means.

The control means responds to the determining means so as to continuously control the adjustable gain and amplitude of the current pulse. This changes the output signal amplitude range so that it is substantially equal to the predetermined operating range of the receiver.

The control means includes a means for setting the adjustable gain to a minimum. It also includes a means which responds to the laser output light and the adjustable gain setting means to control the source so as to set the bias current to have a predetermined amplitude which is less than a threshold amplitude and to set the pulse current amplitude such that the amplitude range of the output signal is less than the amplitude limits of the receiver. The control further includes a circuit for adjusting the adjustable gain of the receiver from the minimum so as to minimize any offset between the amplitude range of the output signal and the receiver amplitude limits.

DESCRIPTION OF THE PREFERRED EMBODIMENT

Figure 1:
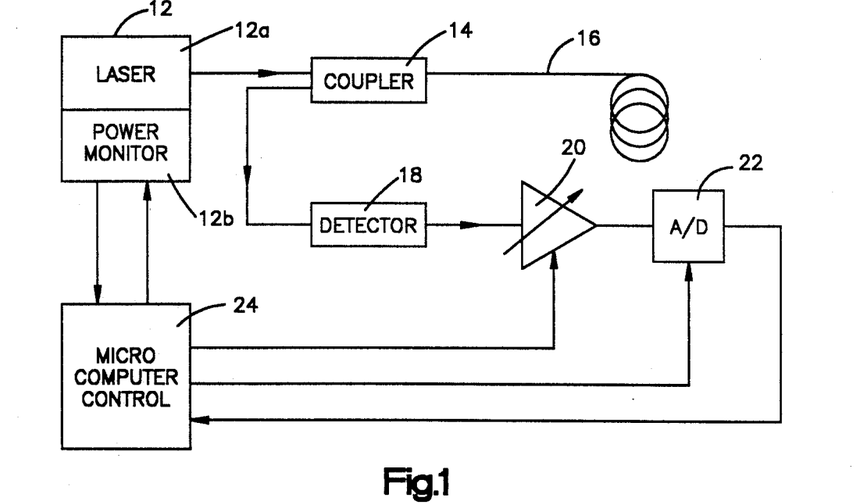
FIG. 1 shows a block diagram of an optical time domain reflectometer (OTDR) embodied in accordance with the present invention.

Referring now to FIG. 1, there is shown the block diagram of an OTDR 10 in which the laser power control of the present invention may be used. OTDR 10 includes a laser circuit 12 comprising a laser module 12a which is connected through coupler 14 to the optical fiber 16 to be monitored. Laser circuit 12 also includes a power monitor 12b which provides both the bias current for laser module 12a and the current to be pulsed through the laser module when it is desired to transmit light on fiber 16. As will be described in more detail hereinafter monitor 12b includes means to monitor both the average power and peak power out of laser module 12a to thereby advantageously control operation of module 12a.

OTDR 10 sends a pulse of light into fiber 16. As the light pulse travels along fiber 16 each discrete point on the fiber scatters some of the light back towards the OTDR. That "backscattered" light is received at coupler 14. The distance along fiber 16 that the light pulse can travel before such backscatterings are no longer discernible depends on the length of the fiber, the amplitude of the pulse and the sensitivity of the receiver. Assuming that the amplitude of the pulse is sufficient for the fiber length, a plot of backscattered amplitude versus time (in effect fiber length) for the entire length of the fiber may then be obtained.

A fault may occur on the fiber between the location of OTDR 10 and the fiber end for any one of a number of reasons. That fault may either be of the reflective or non-reflective type. In a reflective type fault, the amplitude of the light received at the OTDR from the fault is substantially higher than the backscatter is at that distance from the OTDR without such a fault. In a non-reflective fault, there isn't any light received at the OTDR from the fault, i.e. the fiber 16 appears to be shorter than it actually is.

Figure 2:
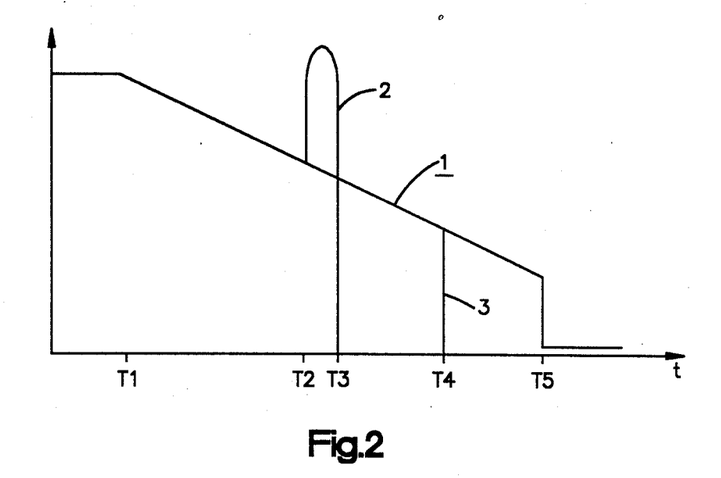
FIG. 2 shows the waveform of light amplitude versus time for the light received back at the OTDR from the optical fiber.

Referring now to FIG. 2, there is shown a waveform 1 of light amplitude versus time. The waveform 1 is for a fiber without a fault. The time interval between zero and $T_1$ represents the width of the pulse from laser module 12a. The declining portion of waveform 1 between $T_1$ and $T_5$ represents the backscattered light received at the OTDR from a fiber 16 which does not have a fault. The time $T_5$ represents the natural end of the fiber.

Also shown in FIG. 2 are the effects of a reflective and a non-reflective fault. The reflective fault causes a peak 2 in waveform 1. The non-reflective fault causes waveform 1 to appear to have a termination 3 which occurs at a time which is earlier than time $T_5$. Solely for purposes of illustration, the peak 2 has been shown to occur between $T_2$ and $T_3$ and the termination 3 has been shown to occur at $T_4$. A fault may, of course, occur anywhere on the fiber between OTDR 10 and the fiber end.

Referring once again to FIG. 1, the light amplitude received at coupler 14 from optical fiber 16 is connected by a detector 18 to an adjustable gain and offset circuit 20. The output of circuit 20 is connected to A/D converter circuit 22. Microcomputer control circuit 24 is connected between circuit 22 and power monitor 12b to provide a controlling input to monitor 12b. Control circuit 24 also provides a controlling input to circuit 20 to thereby adjust the gain and offset as will be described in more detail hereinafter. Circuit 24 also provides the timing signal for converter circuit 22.

Figure 3:
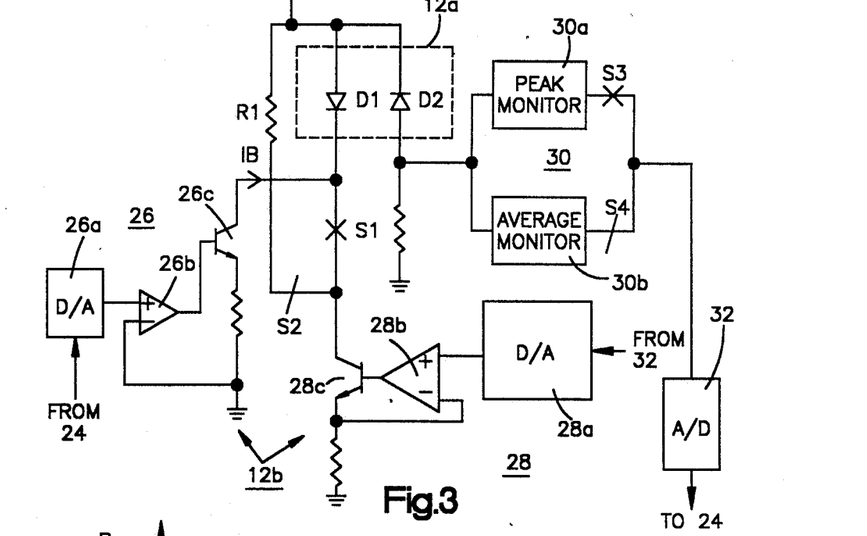
FIG. 3 shows a detailed schematic-block diagram for the laser module and power monitor of the OTDR shown in FIG. 1.

Referring now to FIG. 3, there is shown a detailed schematic-block diagram for laser module 12a and power monitor 12b. The module 12a comprises light emitting diode D1 and detecting diode D2. Power monitor 12b includes a first current source 26 which is connected directly to diode D1. Monitor 12b also includes a second current source 28 which is connected to diode D1 through normally open switch S1. Current source 26 provides the bias current for the diode D1 and current source 28 provides the current to be pulsed through the diode D1 when it is desired to transmit light on fiber 16. Each of the current sources 26 and 28 are under the control of microcomputer control circuit 24.

Power monitor 12b further includes a monitoring circuit 30 which comprises peak monitoring circuit 30a and average monitoring circuit 30b each of which are connected to receive the output of detecting diode D2. The output of circuits 30a and 30b are connected by switches S3 and S4, respectively, to A/D converter circuit 32. The operation of the switches S3 and S4 is controlled by control circuit 24 to select the output of either circuit 30a or circuit 30b as the input to circuit 32. The output of A/D converter circuit 32 is monitored by control circuit 24. Circuit 24 uses that information to control current sources 26 and 28. Circuit 24 also controls the operation of gain and offset circuit 20 as described hereinafter in connection with FIG. 5.

Figure 4A:
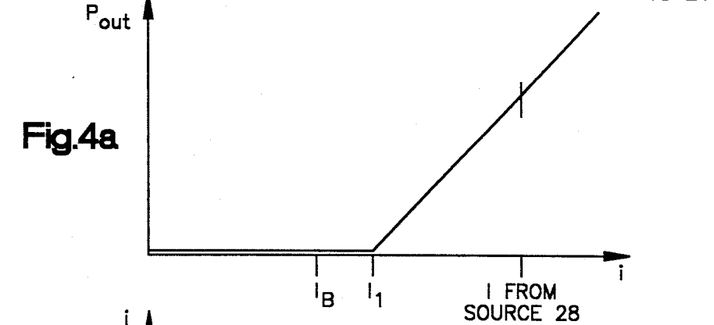
FIGS. 4a and 4b show, respectively, waveforms of laser power out versus current and laser current versus time for the OTDR of FIG. 1.
Figure 4B:
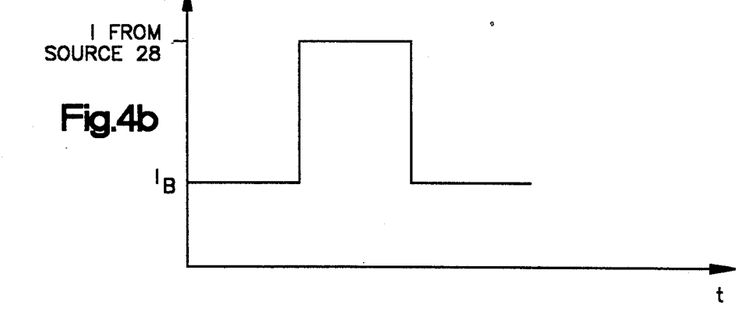

The operation of current sources 26 and 28 will now be described with reference to the waveforms shown in FIGS. 4a and 4b of laser power out versus current flowing in diode D1 and laser current versus time, respectively. As can be seen from the waveform of FIG. 4a, the power out of the diode is essentially zero, i.e. no quiescent light is present on fiber 16, from zero current to a threshold current identified as $I_1$. As the current increases from $I_1$, the power out of the diode increases linearly.

Source 26 is controlled to provide a bias current, $I_B$, which is between zero current and $I_1$ but close to $I_1$ for the reasons described below. As $I_B$ is less than $I_1$, there isn't any quiescent light on the fiber when the only current flowing in diode D1 is $I_B$. By setting $I_B$ to be slightly less than $I_1$, the pulse of light which is generated by diode D1 when it receives a current pulse from source 28 has relatively sharp rise and fall times. In addition, by setting $I_B$ to be slightly less than $I_1$, the shape of the light pulse does not vary significantly with changes in operating temperature of diode D1.

Average monitoring circuit 30b in combination with microcomputer control circuit 24 is used to set the bias current at the initial setup of OTDR 10. Current source 26 comprises D/A converter circuit 26a, amplifier 26b and transistor 26c. Circuit 24 first sets the bias current to zero through circuit 26a and amplifier 26b which controls the conduction of transistor 26c. The bias current is then increased in predetermined steps by control circuit 24. Circuit 30b monitors the average power out of diode D1. When the average power out of D1 becomes nonzero, this is an indication that the bias current has just exceeded $I_1$. Control circuit 24 then controls the conduction of transistor 26c so that $I_B$ is a predetermined and very high percentage of the bias current which has produced the detected nonzero average power. While the bias current is set at the initial setup of OTDR 10, circuits 30b and 24 can be used to reset the bias current during the operation of OTDR 10.

Current source 28 is controlled to provide the current pulse to diode D1 when it is desired to generate a pulse of light for transmission on fiber 16. This control of source 28 is provided by circuit 30a in combination with circuit 24. More specifically, current source 28 includes D/A converter circuit 28a, amplifier 28b and transistor 28c which respond to circuit 24 to provide the current to the diode D1. Normally open switch S1 is closed when it is desired to transmit a pulse of light on fiber 16. A resistor R1 is connected in series combination with a normally closed switch S2. That combination is in parallel with the series combination of diode D1 and switch S1. Switch S2 is opened when switch S1 is closed. Resistor R1 ensures that there is a constant flow of current from source 28, i.e., current continually flows from source 28 and when it is not desired to transmit a pulse of light on fiber 16 the current from source 28 flows through R1.

Circuit 30a monitors the peak power out of diode D1 to ensure that the current from source 28 does not exceed the peak rating of the diode. This monitoring of the peak power also ensures that the diode will not age prematurely. As will be described in more detail hereinafter, monitoring of the peak laser power is also important as OTDR 10 is taking the average over time of a number of samples of the light received back at the OTDR from fiber 16 to obtain the waveform shown in FIG. 2. The monitoring by circuit 30a of the peak power out of D1 allows circuit 24 to adjust source 28 to compensate for changes in the amplitude of the current pulse with time. Therefore, it is not necessary for OTDR 10 to normalize every sample in order to obtain the average.

Figure 5:
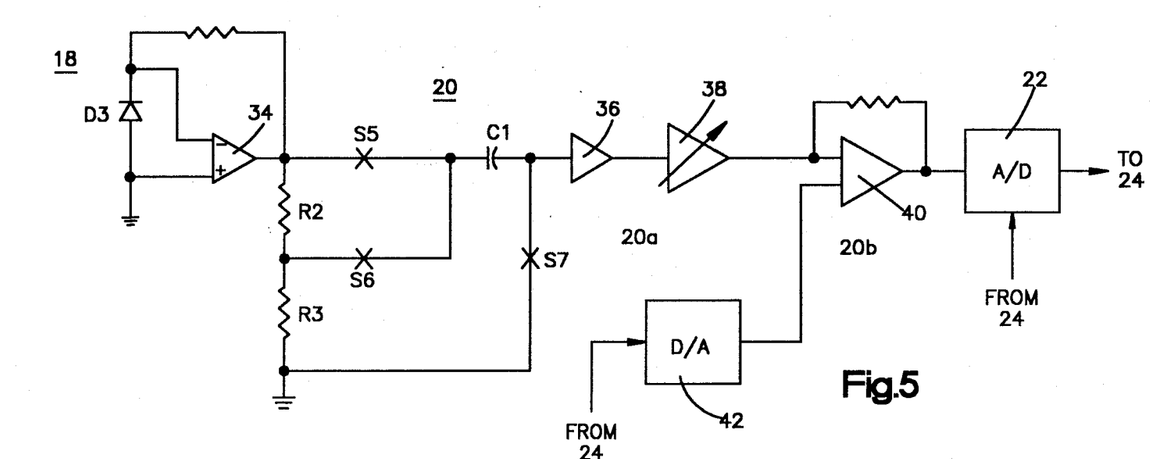
FIG. 5 shows a schematic-block diagram for the detector, adjustable gain and offset circuit and A/D converter circuit of the OTDR shown in FIG. 1.

Referring now to FIG. 5, there is shown a schematic-block diagram for detector 18, adjustable gain and offset circuit 20 and A/D converter circuit 22 of FIG. 1. Detector 18 is embodied in the form of detecting diode D3. It converts the light received at coupler 14 from fiber 16 in to an analog electrical signal which has the waveform shown in FIG. 6. Therefore, each time laser module 12a transmits a pulse of light on fiber 16 there appears at the output of diode D3 an electrical signal having the waveform shown in FIG. 6, which represents the light received at OTDR 10 from optical fiber 16.

As has been described in connection with FIG. 1, the output of converter circuit 22 is connected to microcomputer control circuit 24. Circuit 22 converts the analog signal from diode D3 into a digital signal which can be stored in and operated on by circuit 24. OTDR 10 takes the average over time of a predetermined number of samples of the light received at diode D3 in order that the waveform shown in FIG. 2 can be displayed. It is circuit 24 which performs that averaging.

A/D converter circuit 22 has a predetermined range of voltage over which it operates. For example, that range may lie between the voltages $+V_1$ and $-V_1$ which are shown on the waveform of FIG. 6. Analog signals whose amplitude ranges are within the operating range of circuit 22 will be fully converted by that circuit into digital signals, i.e., no information will be lost about those signals. An analog signal whose amplitude falls outside of the converter operating range will not be fully converted. Information about the signal will then be lost. Therefore, it is desirable that the analog signal amplitude into the converter be adjusted to ensure that it does not fall outside of the converter's operating range.

In order that OTDR 10 have sufficient resolution so that the waveform of FIG. 2 can easily be used to accurately locate the site of a fault, it is desirable for circuit 22 to convert the sample of the analog reflected light signal at its input in to more, rather than less, bits. The more bits that the analog sample is converted into by circuit 22, the more samples that can be included in the averaging performed by circuit 24. In addition, the more bits that an A/D converter converts an analog signal into, the lower will be the quantizing noise. Adjustable gain and offset circuit 20 functions to not only keep the sample within the A/D converter operating range but also to ensure that each sample has minimum and maximum amplitudes such that it fills the entire operating range of converter circuit 22.

As will be described in more detail hereinafter, circuit 20 accomplishes that result by minimizing the difference or offset between the minimum amplitude of each sample and the lower voltage, $-V_1$, of the converter operating range. That difference is labeled X in FIG. 6. It also accomplishes that result by minimizing the difference or offset between the peak amplitude of each sample and the upper voltage, $+V_1$, of the converter operating range. That difference is labeled Y in FIG. 6. More specifically, circuit 20 comprises gain adjust circuit 20a which adjusts sample maximum amplitude so as to minimize Y and offset adjust circuit 20b which adjusts sample minimum amplitude so as to minimize X.

The analog electrical signal at diode D3 is amplified by amplifier 34 which has a fixed positive gain. That amplified signal is connected to circuit 20 and more particularly to the input of circuit 20a. Circuit 20a includes switches S5, S6 and S7. Those switches receive signals to control their switching from A/D converter circuit 32. Those signals and connections therefor are not shown in FIG. 5. As described previously in connection with FIG. 3, the input to circuit 32 is controlled by circuit 24. Therefore, switches S5, S6 and S7 are under the control of circuit 24.

When only switch S5 is closed (switches S6 and S7 are open) a connection is provided through capacitor C1 between the input to circuit 20a and the input to amplifier 36. When only switch S6 is closed (switches S5 and S7 are open) a connection is provided through the series combination of resistor R2 and capacitor C1 between the input to circuit 20a and the input to amplifier 36. Finally, when only switch S7 is closed (switches S5 and S6 are open) a connection is provided through the series combination of resistors R2 and R3 between the input to circuit 20a and the input to amplifier 36.

The resistance of resistors R2 and R3 are selected such when only switch S6 is closed by circuit 24 the signal at the input to amplifier 36 has only one one hundredth of the amplitude that it has when only switch S5 is closed by circuit 24. In effect, switch S5 can be considered to provide when closed a divide by one and switch S6 can be considered to provide when closed a divide by 100. The primary purpose of the divide by 100, i.e. switch S6, is to reduce the amplitude of the signal at the output of diode D3 when a reflective fault occurs on fiber 16 at a location which is physically close to OTDR 10. The occurrence of such a fault gives rise to a peak 2 in waveform 1 (see FIG. 2) which has a very high amplitude. OTDR 10 may not be able to sufficiently control the adjustable gain of circuit 20 so as to reduce that very high amplitude.

Switch S7 when closed by circuit 24 provides a DC reference voltage to the input of amplifier 36. This reference voltage is ground, i.e. zero volts, for the embodiment shown in FIG. 5. That reference voltage is provided before laser diode D1 is pulsed by current source 28. As described above OTDR 10 takes the average over time of a predetermined number of samples of the light received at diode D3. The DC reference voltage provided when switch S7 is closed makes it easier for circuit 24 to calculate that average as it ensures that each of the returned signals to be included in the average all start at the same level.

Capacitor C1 removes any DC bias voltage that is present on the signal at diode D3. It is desirable to remove that bias voltage as it has been amplified by amplifier 34.

Figure 6:
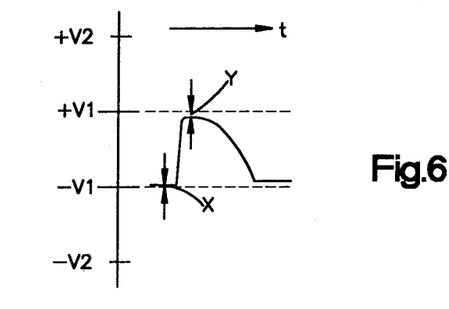
FIG. 6 shows the waveform of the electrical signal at the output of the detector of FIG. 5.

Amplifier 36 also provides a fixed positive gain to the signals at its input. The amplitude of the signal at the output of amplifier 36 is then equal to the amplitude of the signal at the output of diode D3 multiplied by the product of the gains of amplifiers 34 and 36 and the attenuation factor provided by switch S6 if it is closed. The signal at the output of amplifier 36 is connected to variable gain or attenuation circuit 38. The amount of gain or attenuation to be provided by circuit 38 is controlled by circuit 24 so that in combination with the control provided by circuit 24 to current source 28 the offset Y shown in FIG. 6 is minimized. Circuit 38 may be embodied in the form of a multiplying D/A converter.

The output of circuit 38 is connected as one of the two inputs to amplifier 40. The other input to amplifier 40 is from D/A converter circuit 42 which receives an input from circuit 24. Amplifier 40 has a fixed attenuation and provides at its output a signal which is the difference between the two inputs to the amplifier multiplied by the fixed attenuation. Circuit 24 controls the input to amplifier 40 so as to minimize the offset X shown in FIG. 6. In one embodiment for OTDR 10, the fixed attenuation of amplifier 40 was set at one-half.

Each of amplifiers 34, 36 and 40 operate over the range of voltages $+V_2$ to $V_2$ where:

$$|V_2| > |V_1|$$

The amplitude of the signal at the output of diode D3 must then be controlled so that it does not fall outside of the operating range of the amplifiers. If that signal did have at the input to any one of the amplifiers an amplitude which fell outside of that operating range that amplifier would saturate thereby clipping the signal. Clipping distorts the signal waveform so that it would not appear as shown in FIG. 6 and the output of A/D converter circuit 22 would not be correct.

It should be appreciated that in OTDR 10 the primary source of noise is the thermal noise present at amplifier 34. In order to minimize that noise, amplifier 34 must have a fixed gain. If amplifier 34 had a variable gain, it would increase the noise in OTDR 10.

It should further be appreciated that in OTDR 10 the electrical signal at the output of diode D3 is an analog rather than a digital signal. If that signal was a digital signal then it would not be necessary to ensure that its amplitude does not exceed the operating range of any one of amplifiers 34, 36 and 40. A digital signal is made up of only "ones" and "zeros" and any clipping to that signal does not distort the "one" or zero". That is not the case where the signal is an analog signal.

As amplifier 34 must have a fixed gain for the reasons described above, the dynamic range of that part of OTDR 10 which receives the signal at the output of diode D3 is limited. Circuit 24 incrementally controls the power into laser diode D1, i.e. incrementally controls current source 28, in the manner described above in connection with FIG. 3 such that OTDR 10 has sufficient dynamic range for the signal received at diode D3. It is that control in combination with the dynamic control provided by circuit 24 of the bias current setting of source 26 to thereby optimize the shape of the pulse of light generated by diode D1 which allows OTDR 10 to be directly and permanently connected to an optical fiber in an unattended office and also accurately provide the location of the fault from the office.

While the power control system of the present invention has been described in connection with a laser used in an OTDR, it should be appreciated that the present invention may be used in connection with lasers used for other purposes, e.g., a laser used to test a length or reel of optical fiber to determine its length and attenuation. In such an application, the laser module 12a and the power monitor 12b would be located at the input end to the optical fiber. The detector 18, the adjustable gain and offset circuit 20 and the A/D converter circuit 22 would be located at the other end of the optical fiber. Microcomputer control circuit 24 could be located at either end of the fiber.

Finally, it should be appreciated that the control of the bias and pulse currents provided by the peak/average monitoring circuit 30 can be used independently of the control of the pulse current provided by the adjustable gain and offset circuit 20. The control provided by circuit 30 ensures that the bias current is set to optimize the shape of the light pulse from the laser when pulse current is provided thereto and that the pulse current amplitude does not exceed the laser's peak rating. The control provided by circuit 20 ensures that the analog signal representative of backscattered light essentially fills but does not exceed the operating range of the amplifiers associated with detector 18 so that the OTDR has the desired dynamic resolution. When used in combination in an OTDR, the controls provided by circuits 20 and 30 allow the OTDR to be directly and permanently connected to the optical fiber, to automatically compensate for changes in laser characteristics and to automatically and accurately provide the location of the fault.

Figure 7A:
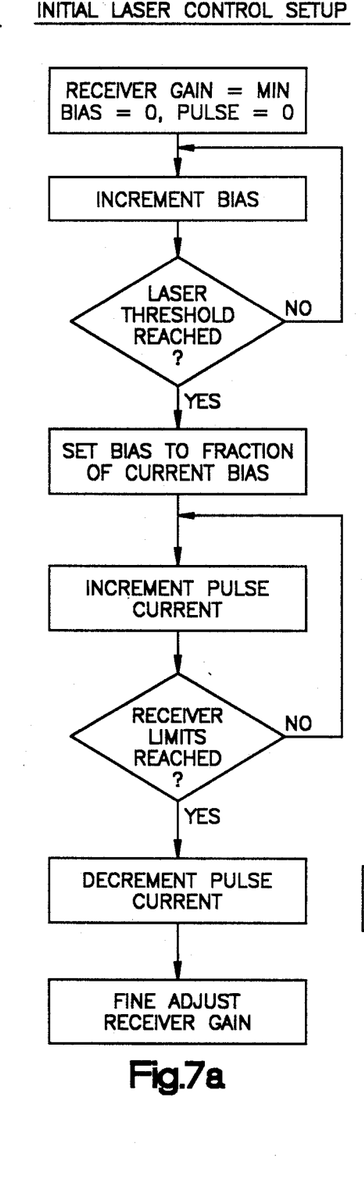
FIGS. 7a and 7b are flow diagrams of the programs used by the microcomputer control circuit of the embodiment shown in FIG. 1 for the initial setup of the OTDR including setting the bias current and for controlling the amplitude of the current pulse to the laser during operation of the OTDR respectively.
Figure 7B:
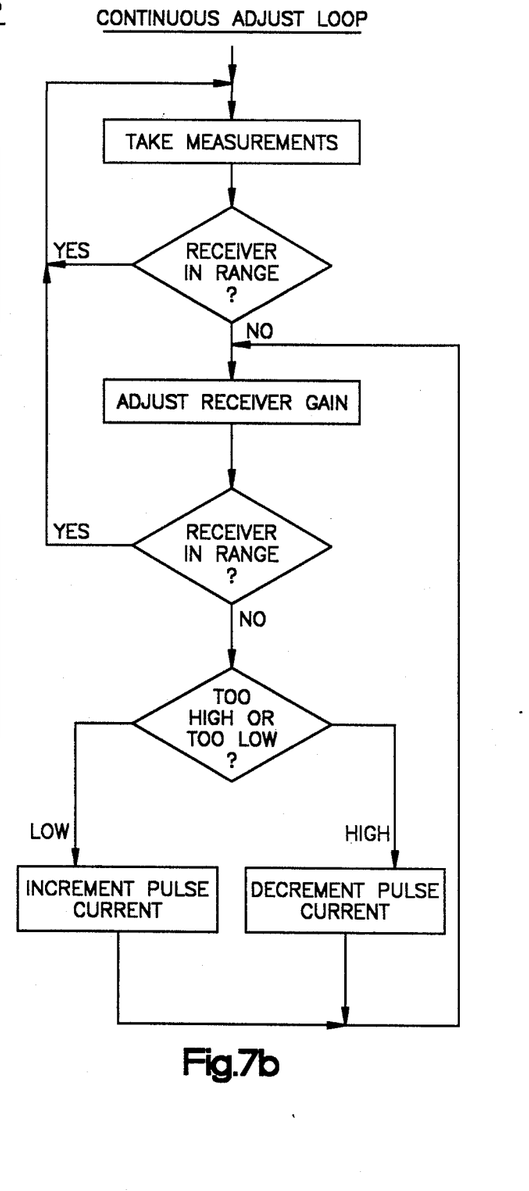

Referring now to FIGS. 7a and 7b, there are shown the flow diagrams of the programs used by circuit 24 for the initial setup of OTDR 10 including the setting of the bias current and for controlling the amplitude of the current pulse to the laser module 12a during operation of OTDR 10, respectively. As each of the flow diagrams are self-explanatory, they will not be discussed in detail.

As shown in FIG. 7a, circuit 24 sets the bias current to be a predetermined fraction of the bias current which produces nonzero average power out of diode D1. That current can be referred to as a "threshold" current. After setting the bias current, circuit 24 then adjusts circuits 20a and 20b so as to minimize the offsets shown in FIG. 6. That adjustment is accomplished by providing a pulse current to diode D1 which is incremented until the amplitude range of the analog signal representative of backscattered light just exceeds the operating range of converter circuit 22. It should be appreciated that at the end of executing the initial setup program, circuit 24 has adjusted OTDR 10 for maximum performance for an optical fiber 16 which does not have a fault.

As shown in FIG. 7b, circuit 24 after the initial setup then continually adjusts circuits 20a and 20b to ensure that OTDR 10 is maintained in that condition which maximizes its performance as well as providing the necessary control during the occurrence of a fault. This continuous adjustment provided by circuit 24 automatically compensates for any changes that may occur in the operating characteristics of OTDR 10 due to aging of components, changes in temperature, etc.

It is to be understood that the description of the preferred embodiment is intended to be only illustrative, rather than exhaustive, of the present invention. Those of ordinary skill will be able to make certain additions, deletions, and/or modifications to the embodiment of the disclosed subject matter without departing from the spirit of the invention or its scope, as defined by the appended claims.

What is claimed is:

1. An instrument comprising:
   (a) laser means responsive to a current pulse for generating output light to an optical fiber;
   (b) means for detecting light from said fiber when said laser means output light is connected to said fiber and generating an electrical signal having an amplitude whose range is related to the intensity range of said light;
   (c) means having a predetermined operating range and an adjustable gain for providing an output signal having an amplitude range which is said electrical signal amplitude range multiplied by said adjustable gain;
   (d) means for determining when said output signal amplitude range is not substantially equal to said predetermined operating range; and
   (e) means responsive to said determining means for continuously controlling said adjustable gain and the amplitude of said current pulse to thereby change said output signal amplitude range so that it is substantially equal to said predetermined operating range.

2. The instrument of claim 1 wherein said continuously controlling means is a program controlled means having a loop of instructions for changing said adjustable gain and said current pulse amplitude.

3. The instrument of claim 2 wherein said determining means is included in said program controlled means, said program controlled means having instructions for comparing said output signal amplitude range to said predetermined operating range.

4. The instrument of claim 1 wherein said fiber has two detecting means detects light backscattered from said fiber.

5. The instrument of claim 2 wherein said detecting means detects light backscattered from said fiber.

6. The instrument of claim 3 wherein said detecting means detects light backscattered from said fiber.

7. An instrument comprising:
   (A) source means for providing to a laser means both bias and pulse currents with a controllable amplitude;
   (B) said laser means generating output light to an optical fiber when said pulse current amplitude exceeds a threshold amplitude;
   (C) receiving means having amplitude limits and an adjustable gain for providing an output signal whose amplitude range is related to the amplitude range of an electrical signal representative of light from said fiber when said laser means output light is connected to said fiber multiplied by said adjustable gain; and
   (D) control means comprising:
      (i) first means for setting said adjustable gain to a minimum;
      (ii) second means responsive to said output light and said first means for controlling said source means to:
         (a) set said bias current to have a predetermined amplitude which is less than said threshold amplitude; and
         (b) set said pulse current amplitude such that said output signal amplitude range is less than said receiving means amplitude limits; and
      (iii) means for adjusting said receiving means adjustable gain from said minimum so as to minimize any offset between said output signal amplitude range and said receiving means amplitude limits.

8. The instrument of claim 7 wherein said control means second means is a program controlled means having a first loop of instructions for setting said bias current amplitude and a second loop of instructions for setting said pulse current amplitude.

9. The instrument of claim 7 wherein said first means also sets said bias and pulse current amplitudes to essentially zero.

10. The instrument of claim 9 wherein said control means is a program controlled means having one or more instructions for setting said adjustable gain and said bias and pulse current amplitudes and also having a first loop of instructions for setting said bias current amplitude and a second loop of instructions for setting said pulse current amplitude.

11. The instrument of claim 7 wherein said electrical signal is representative of light backscattered from said fiber.

12. The instrument of claim 7 wherein said control means is a program controlled means having one or more instructions for setting said adjustable gain to a minimum and also having a first loop of instructions for setting said bias current amplitude and a second loop of instructions for setting said pulse current amplitude.

13. A method for initially adjusting the amplitude of bias and pulse currents applied to a laser having a threshold current amplitude and the gain of a receiver having amplitude limits, said receiver responsive to an electrical signal representative of light from a fiber when a pulse of light from said laser is connected to said fiber, said method comprising the steps of:
   (a) setting said receiver gain to a minimum and said bias and pulse current amplitudes to be essentially equal to zero;
   (b) repetitively increasing by a predetermined increment of bias current amplitude said bias current amplitude from said essentially zero amplitude until said bias current amplitude just exceeds said threshold current amplitude;
   (c) setting said bias current amplitude to a predetermined amplitude which is less than said threshold current amplitude;
   (d) repetitively increasing by a predetermined increment of pulse current amplitude said pulse current amplitude from said essentially zero amplitude until the amplitude of said signal representative of light from said fiber reaches said receiver amplitude limits; and
   (e) decreasing by said predetermined pulse current amplitude increment said pulse current amplitude whereby said fiber light representative signal amplitude is less than said receiver amplitude limits.

14. The method of claim 13 further comprising after step (e) the step of:

(f) adjusting said receiver gain from said minimum gain so as to minimize any offset between said fiber light representative signal amplitude and said receiver amplitude limits.

15. The method of claim 13 wherein said step of repetitively increasing said bias current amplitude by a predetermined amplitude increment comprises the steps of:
  (i) increasing said bias current amplitude from its present amplitude by said predetermined increment of bias current amplitude;
  (ii) determining if said bias current amplitude does or does not exceed said threshold current amplitude and going on to step (c) when said bias current amplitude first exceeds said threshold current amplitude; and
  (iii) repeating steps (i) and (ii) if said bias current amplitude does not exceed said threshold current amplitude.

16. A method for adjusting the amplitude of pulse current applied to a laser and the gain of a receiver having amplitude limits, said receiver responsive to an electrical signal representative of light from a fiber when a pulse of light from said laser is connected to said fiber, said method comprising the steps of:
  (a) determining if said representative electrical signal amplitude is or is not substantially equal to said receiver amplitude limits; and
  (b) continuously adjusting said receiver gain and said pulse current amplitude if said representative electrical signal amplitude is not substantially equal to said receiver amplitude limits so as to cause said representative electrical signal amplitude to become substantially equal to said receiver amplitude limits.

17. The method of claim 16 wherein said step of continuously adjusting said receiver gain and said pulse current amplitude comprises the steps of:
  (i) adjusting said receiver gain if said representative electrical signal amplitude is not substantially equal to said receiver amplitude limits;
  (ii) determining if said representative electrical signal amplitude multiplied by said adjusted receiver gain is or is not substantially equal to said receiver amplitude limits; and
  (iii) adjusting said pulse current amplitude and returning to step (i) if said representative electrical signal amplitude multiplied by said adjusted receiver gain is not substantially equal to said receiver amplitude limits.

* * * * *